United States Patent
Candidus et al.

(10) Patent No.: US 11,415,648 B2
(45) Date of Patent: Aug. 16, 2022

(54) MULTILAYER MR LOCAL COIL

(71) Applicant: Siemens Healthcare GmbH, Erlangen (DE)

(72) Inventors: Yvonne Candidus, Fürth (DE); Thomas Kundner, Buckenhof (DE); Christina Strauchmann, Eggolsheim (DE); Martin Zigann, Erlangen (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 174 days.

(21) Appl. No.: 16/664,772

(22) Filed: Oct. 25, 2019

(65) Prior Publication Data

US 2020/0132789 A1  Apr. 30, 2020

(30) Foreign Application Priority Data

Oct. 26, 2018 (DE) ..................... 10 2018 218 380.5

(51) Int. Cl.
*G01R 33/341* (2006.01)
*H01F 27/28* (2006.01)
*H01F 7/20* (2006.01)

(52) U.S. Cl.
CPC .......... *G01R 33/341* (2013.01); *H01F 7/202* (2013.01); *H01F 27/28* (2013.01)

(58) Field of Classification Search
CPC ........ G01R 33/34007; G01R 33/34084; G01R 33/341; G01R 33/3415; H01F 27/28; H01F 7/20; H01F 7/202
See application file for complete search history.

(56) References Cited

U.S. PATENT DOCUMENTS

| | | | |
|---|---|---|---|
| 7,826,887 B2 | 11/2010 | Driemel | |
| 8,244,328 B2 | 8/2012 | Biber | |
| 9,285,440 B2 | 3/2016 | Driemel | |
| 2012/0256633 A1 | 10/2012 | Biber | |
| 2013/0249559 A1* | 9/2013 | Biber | G01R 33/56536 324/322 |
| 2015/0057527 A1 | 2/2015 | Driemel | |
| 2015/0057528 A1 | 2/2015 | Driemel | |
| 2018/0017643 A1 | 1/2018 | Zink | |
| 2018/0372815 A1 | 12/2018 | Candidas | |
| 2018/0372816 A1 | 12/2018 | Nowak | |

FOREIGN PATENT DOCUMENTS

| | | | |
|---|---|---|---|
| DE | 102011007065 A1 | 10/2012 | |
| DE | 102017210420 A1 | 12/2018 | |
| JP | 2013063271 A * | 4/2013 | ......... G01R 33/3642 |

OTHER PUBLICATIONS

German Office Action for German Application No. 10 2018 218 380.5 dated Jul. 10, 2019.

* cited by examiner

*Primary Examiner* — Jay Patidar
(74) *Attorney, Agent, or Firm* — Lempia Summerfield Katz LLC

(57) ABSTRACT

A magnetic resonance (MR) local coil and an MR apparatus are provided. The MR local coil includes at least one antenna layer, at least one first layer, at least one second layer, and at least one third layer. In this structure, at least one MR antenna is arranged on the antenna layer. The at least one first layer is arranged between the at least one antenna layer and the at least one second layer, and the at least one second layer is arranged between the at least one first layer and the at least one third layer.

20 Claims, 3 Drawing Sheets

MULTILAYER MR LOCAL COIL

This application claims the benefit of DE 10 2018 218 380.5, filed on Oct. 26, 2018, which is hereby incorporated by reference in its entirety.

BACKGROUND

The present embodiments relate to a magnetic resonance (MR) local coil and an MR apparatus.

In the field of medical engineering, imaging by MR, also known as magnetic resonance tomography (MRT) or magnetic resonance imaging (MRI), is characterized by high soft tissue contrasts. With this technique, radiofrequency excitation pulses are radiated into a patient with the aid of an MR apparatus. Magnetic resonance signals are triggered in the patient as a result. The magnetic resonance signals are received as measurement data by one or more MR antennas and used for the reconstruction of magnetic resonance images.

The magnetic resonance signals are frequently received by devices known as MR local coils (e.g., surface coils). Typically, these are antenna systems that are placed in immediate proximity to the patient. Examples of conventional MR local coils are described in U.S. Pat. No. 9,285,440 B2, U.S. Pat. No. 7,826,887 B2, US 20150057527 A1, US 20150057528 A1, US 2012256633 A1, US 20180017643 A1, or U.S. Pat. No. 8,244,328B2.

In order to place an MR local coil as close as possible to the patient, it is advantageous if the MR local coil may be flexibly adapted to conform to the shape of the patient. In conventional flexible MR local coils, MR antennas are arranged between two layers made of foam that are fixedly joined to the MR antennas by a thermal process.

For safety reasons, the foam layers have a certain minimum thickness. However, this results in a relatively high restoring force, which limits the ability of the MR local coil to adapt to the patient.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a better adaptability of a magnetic resonance (MR) local coil to the patient compared to the prior art may be provided.

An MR local coil that includes at least one antenna layer (e.g., an antenna layer), at least one first layer (e.g., a first layer), at least one second layer (e.g., a second layer), and at least one third layer (e.g., a third layer) is provided. At least one MR antenna is arranged on the at least one antenna layer. The at least one first layer is arranged between the at least one antenna layer and the at least one second layer, and the at least one second layer is arranged between the at least one first layer and the at least one third layer.

As a result of such a multilayered construction, the MR local coil may be more effectively adapted to fit a patient. For example, each layer may be optimized separately from the other layers to satisfy specific requirements. For example, the surfaces of the layers may be configured in a selective manner in terms of sliding behavior and/or cleanability. The density and/or the flexibility of the layers may be adjusted such that the layer system is lighter and/or more flexible than conventional MR local coils. Safety aspects, for example, such as the distance between the MR antennas and/or any electronics and the patient to be examined may be taken into account in a targeted manner.

A layer may, for example, be referred to also as a tier. A layer may be, for example, a planar structure, the extent of which along the surface is substantially greater (e.g., more than 100 times greater) than perpendicularly thereto.

In one embodiment, the first layer and/or the second layer and/or the third layer are arranged on both sides around the antenna layer. For example, a top first layer is arranged on a top side of the antenna layer, and a bottom first layer is arranged on a bottom side of the antenna layer that lies opposite the top side. For example, a top second layer is arranged on the top side of the antenna layer. The top first layer is arranged between the antenna layer and the top second layer. For example, a bottom second layer is arranged on the bottom side of the antenna layer, the bottom first layer being arranged between the antenna layer and the bottom second layer. For example, a top third layer is arranged on the top side of the antenna layer, the top second layer being arranged between the antenna layer and the top third layer. For example, a bottom third layer is arranged on the bottom side of the antenna layer, the bottom second layer being arranged between the antenna layer and the bottom third layer.

In one embodiment, a first layer, a second layer, and a third layer are in each case arranged in this order on both sides with increasing distance from the antenna layer of the antenna layer. In another embodiment, one or more layers are missing on one side of the antenna layer. For example, a first layer, a second layer, and a third layer may be arranged on one side of the antenna layer, and only a first layer and a third layer are arranged on the opposite side.

The MR local coil may, for example, include multiple antenna layers that are arranged adjacent to one another. For example, the multiple antenna layers may be arranged such that the surfaces of the antenna layers are located in the same plane. For example, the multiple antenna layers may overlap.

For the sake of linguistic simplification, the first layer, the second layer, and the third layer are referred to in the following in the singular. However, this does not rule out the possibility that a plurality of first layers, a plurality of second layers, and/or a plurality of third layers may also possess the described property or the described feature.

In one embodiment, the antenna layer, the first layer, the second layer, and the third layer are flexible at least in certain sections so that the layers may be bent at least in certain sections. If the flexible sections of the layers lie congruently one on top of the other, this also makes the MR local coil as a whole better adaptable to match a patient geometry.

In one embodiment, one or more of the layers also include rigid sections in addition to flexible sections. For example, the antenna layer may include rigid electronic components. In the ideal case, such rigid sections limit the flexibility of the MR local coil overall only to a small degree.

A further embodiment of the MR local coil provides that the first layer is movable (e.g., slidable) relative to the second layer (e.g., the adjoining second layer). In one embodiment, the first layer is movable (e.g., slidable) relative to the second layer (e.g., the adjoining second layer) tangentially to the surface of the first layer. In one embodiment, the first layer may slide relative to the, for example, adjoining second layer. For example, the first layer has no fixed connection to the second layer (e.g., adjoining second layer). A further variant provides that the first layer has a fixed connection to the second layer (e.g., the adjoining second layer), which nonetheless allows a mechanical play such that the first layer remains movable relative to the second layer. For example, a tape may be fixedly connected to the first layer on one side and to the second layer on the other side.

For example, any surface irregularities on the antenna layer caused, for example, by components that are arranged on the antenna layer may be concealed by the first layer. The first layer may form a smoothed surface to the second layer, which facilitates the movement of the antenna layer relative to the second layer.

A further variant of the MR local coil provides that the second layer is movable (e.g., slidable) relative to the third layer (e.g., the adjoining third layer). In one embodiment, the second layer is movable (e.g., slidable) relative to the third layer (e.g., the adjoining third layer) tangentially to the surface of the second layer. For example, the second layer has no fixed connection to the third layer (e.g., the adjoining third layer). A further variant provides that the second layer is joined to the, for example, adjoining third layer by a fixed connection, which nonetheless allows a mechanical play such that the second layer remains movable relative to the third layer. For example, a tape may be fixedly connected to the second layer on one side and to the third layer on the other side.

The first layer, the second layer, and the third layers may therefore change relative position and/or orientation. A possible movement of the layers may, for example, include a relative translation and/or a relative rotation of the layers.

Thanks to the movability of the layers, the three-dimensional adaptability of the MR local coil may be improved because the layers may be adjusted more flexibly as a result of the freedom of movement. The most diverse shapes and/or diameters may be enclosed in an even more tight-fitting manner.

The antenna layer may include at least one substrate (e.g., a flexible printed circuit board), at or on which one or more MR antennas are arranged. A substrate may be, for example, a planar carrier material.

The MR antenna may be joined to the substrate in a fixed and/or rigid and/or planar manner. For example, the MR antenna is imprinted and/or adhesively affixed on the substrate. The MR antenna may, for example, be applied on one side or on both sides on the substrate. In a double-sided MR antenna, a connection from one side to the other may be realized by vias, for example.

A further embodiment of the MR local coil provides that the antenna layer is movable (e.g., slidable) relative to the first layer. In one embodiment, the antenna layer is movable (e.g., slidable) relative to the first layer tangentially to the surface of the first layer.

A further embodiment of the MR local coil provides that the antenna layer has no fixed connection to the first layer.

A further embodiment of the MR local coil provides that the antenna layer is attached to the first layer at least at certain points and/or in certain sections. For example, the antenna layer may be fixedly connected to the first layer over an entire surface, in certain sections, or at certain points.

A further embodiment of the MR local coil provides that the antenna layer includes at least one rigid section in which the antenna layer is attached to the first layer. Examples of rigid sections are electronics regions. Electronics regions may include, for example, electronic components, circuits, amplifiers, etc.

A further variant of the MR local coil provides that the first layer is embodied to hold at least one component arranged on the antenna layer in position so that the relative position of the components to one another does not change or changes only to a limited degree. For example, the first layer may hold leads between different rigid sections (e.g., electronics regions) in position. The first layer may therefore also be referred to as a fixing layer.

A further embodiment of the MR local coil provides that the first layer encloses the antenna layer at least partially (e.g., completely). For example, a top first layer and a bottom first layer have a common edge region that connects the top first layer to the bottom first layer. In one embodiment, such an edge region limits a possible movement of the antenna layer (e.g., in the tangential direction to the surface of the first layer).

For example, the MR local coil may include multiple antenna layers that are in each case enclosed by a top first layer and a bottom first layer. For example, the MR local coil may include multiple antenna layers that are enclosed by a common top first layer and a common bottom first layer. Hybrid shapes may also be provided.

As well as MR antennas, the antenna layer may also include further components, such as, for example, electronic components. The first layer protects the components of the antenna layer (e.g., against moisture and/or mechanical damage).

In one embodiment, the first layer encapsulates the antenna layer. This enables electronic components of the MR local coil, such as, for example, MR antennas and/or electronic components, to be separated from the rest of the MR local coil.

A further embodiment of the MR local coil provides that the first layer is liquid-tight. This, for example, enables body fluids to be prevented from penetrating into the antenna layer. A possible advantage is that, for example, short-circuits affecting the electronic components of the antenna layer may be avoided.

Potential noise generation caused by components that are arranged on the antenna layer (e.g., due to a movement of the antenna layer) may be contained by the first layer.

In one embodiment, the first layer has a thickness of less than 2 mm (e.g., less than 1 mm or less than 0.5 mm). A small thickness enables a high flexibility of the antenna layer to be achieved.

A further variant of the MR local coil provides that the second layer is a spacer layer that is embodied to provide a predefined minimum clearance between the MR antenna and an exterior of the MR local coil. The minimum clearance enables a safety distance to be set between the MR antenna and the patient.

In one embodiment, the minimum clearance amounts to at least 2 mm (e.g., at least 3 mm or at least 5 mm). For example, the second layer is at least 2 mm thick (e.g., at least 3 mm thick or at least 5 mm thick). In one embodiment, the second layer has a greater thickness than the first layer.

A further embodiment of the MR local coil provides that the spacer layer includes a fibrous web and/or a felt mat and/or a matrix having a plurality of interlinked elements and/or a perforated matrix. Materials or arrangements of the type possess a high degree of flexibility and at the same time are able to absorb a high surface pressure.

A further embodiment of the MR local coil provides that the third layer is a cover layer that encloses the antenna layer, the first layer, and the second layer at least partially (e.g., completely). For example, a top third layer and a bottom third layer have a common edge region that connects the top third layer to the bottom third layer. In one embodiment, such an edge region limits a possible movement of the first layer and/or the second layer (e.g., in the tangential direction to the surface of the third layer).

For example, the third layer envelops the first layer and the second layer at least partially (e.g., completely). For example, the third layer covers the first layer and the second layer at least partially (e.g., completely). The internal layers of the MR local coil may be protected by this.

A further embodiment of the MR local coil provides that the third layer is elastic (e.g., the third layer may reversibly alter a shape and/or dimensions when a pressure is exerted on the third layer). For example, the third layer is elastic tangentially and/or parallel to a surface of the third layer. This enables the MR local coil to adapt more effectively to match the patient geometry.

In one embodiment, two third layers that are arranged on opposite sides of the antenna layer are connected to one another with the aid of a piping strip. Visually and haptically pleasant edges, for example, may be produced as a result.

A further embodiment of the MR local coil provides that the first layer and/or the second layer are embodied as asymmetric relative to the antenna layer. A preferred bending direction and/or a preferred movability of the MR local coil may be achieved as a result.

For example, a first layer is arranged in each case on both sides of the antenna layer, the first layer on one side having different properties than on the other side. For example, a second layer is arranged in each case on both sides of the antenna layer, the second layer on one side having different properties than on the other side. The different properties may include, for example, a different shape and/or a different material.

An MR apparatus having an MR local coil as described hereinabove is also provided. The advantages of the above-described MR local coils may be applied to the MR apparatus.

BRIEF DESCRIPTION OF THE DRAWINGS

Parts equivalent to one another are labeled with the same reference signs in all the figures, in which.

DETAILED DESCRIPTION

Figure 1:
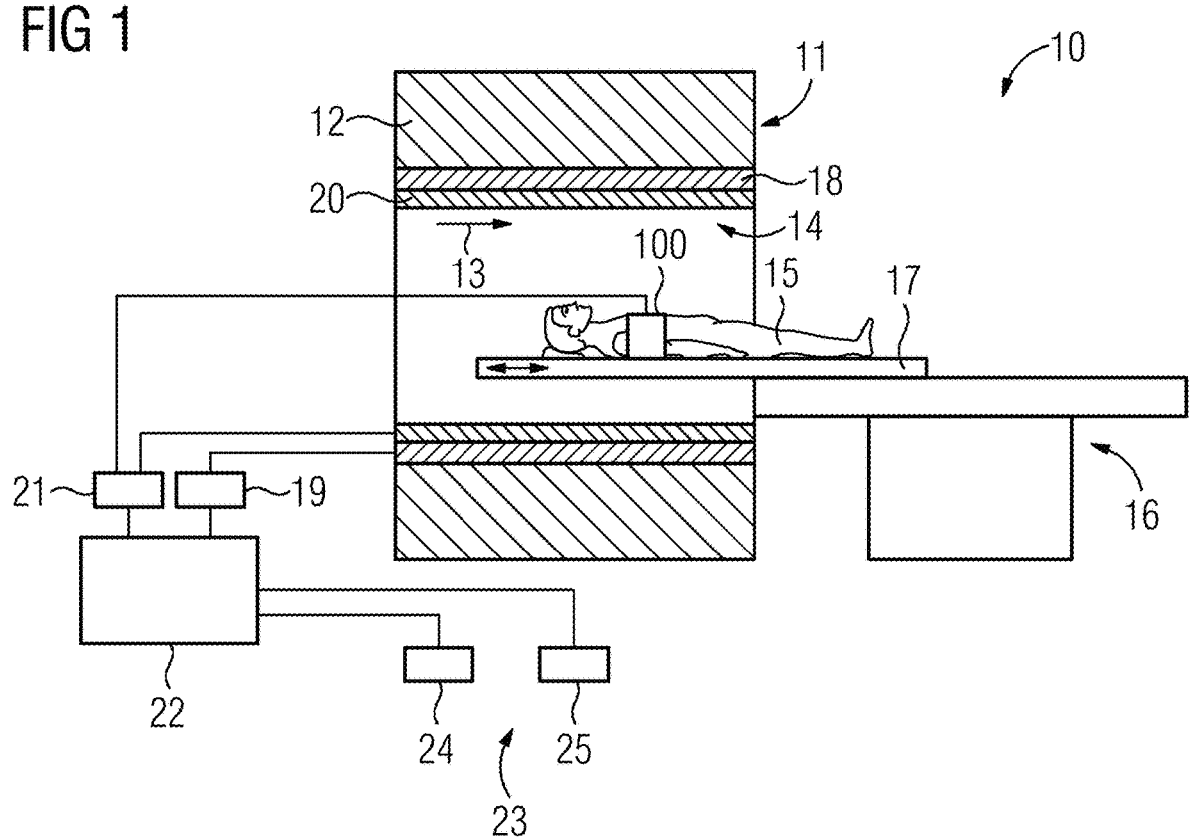
FIG. 1 shows one embodiment of a magnetic resonance (MR) apparatus having an MR local coil in a schematic view.

FIG. 1 shows a magnetic resonance (MR) apparatus 10 in a schematic representation. The MR apparatus 10 includes a magnet unit 11 that has a main magnet 12 for generating a strong and, for example, temporally constant main magnetic field 13. In addition, the MR apparatus 10 includes a patient receiving zone 14 for accommodating a patient 15. The patient receiving zone 14 in the present exemplary embodiment is configured in a cylinder shape and is cylindrically enclosed by the magnet unit 11 in a circumferential direction. In principle, however, a different embodiment of the patient receiving zone 14 may be provided at any time. The patient 15 may be introduced into the patient receiving zone 14 by a patient support and positioning device 16 of the MR apparatus 10. For this purpose, the patient support and positioning device 16 has a patient table 17 that is embodied as movable inside the patient receiving zone 14.

The magnet unit 11 also features a gradient coil unit 18 for generating magnetic field gradients that are used for spatial encoding during an imaging session. The gradient coil unit 18 is controlled by a gradient control unit 19 of the MR apparatus 10. The magnet unit 11 further includes a radiofrequency antenna unit 20 that, in the present exemplary embodiment, is embodied as a body coil permanently integrated into the MR apparatus 10. The radiofrequency antenna unit 20 is configured for exciting atomic nuclei. A state of excitation becomes established in the main magnetic field 13 generated by the main magnet 12. The radiofrequency antenna unit 20 is controlled by a radiofrequency antenna control unit 21 of the MR apparatus 10 and radiates radiofrequency magnetic resonance sequences into an examination chamber that is substantially formed by a patient receiving zone 14 of the MR apparatus 10. The radiofrequency antenna unit 20 is also configured to receive magnetic resonance signals.

The MR apparatus 10 has a system control unit 22 for controlling the main magnet 12, the gradient control unit 19, and the radiofrequency antenna control unit 21. The system control unit 22 is responsible for the centralized control of the magnetic resonance apparatus 10, such as for performing a predetermined imaging gradient echo sequence, for example. The system control unit 22 also includes an evaluation unit (not shown in further detail) for evaluating medical image data acquired during the magnetic resonance examination. The MR apparatus 10 further includes a user interface 23 that is connected to the system control unit 22. Control information, such as imaging parameters, for example, as well as reconstructed magnetic resonance images may be displayed on a display unit 24 (e.g., on at least one monitor) of the user interface 23 for a member of the medical operating staff. The user interface 23 also has an input unit 25 by which information and/or parameters may be input by the medical operating staff during a measurement procedure.

The MR apparatus further includes a magnetic resonance (MR) local coil 100. The MR local coil 100 is arranged on the patient 15 and is connected to the radiofrequency antenna control unit 21. The MR local coil 100 is configured for transmitting radiofrequency magnetic resonance sequences and/or for receiving magnetic resonance signals.

Figure 2:
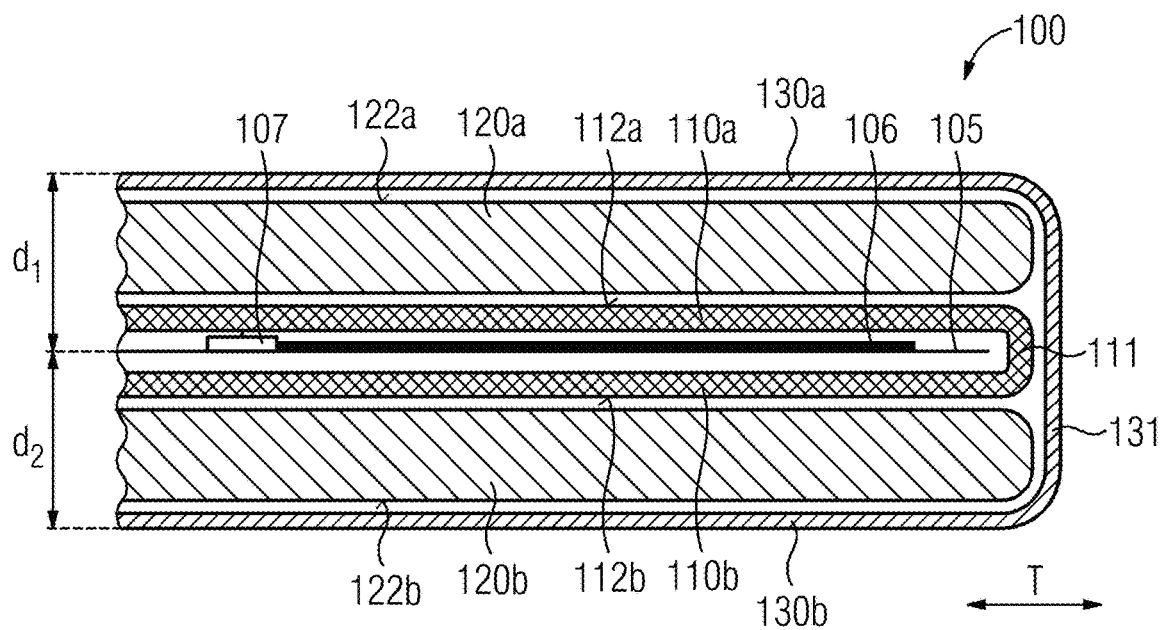
FIG. 2 shows a detail from one embodiment of an MR local coil in a sectional view.

FIG. 2 shows a possible layer structure of the MR local coil 100 in detail. The MR local coil 100 includes an antenna layer 105 on which an MR antenna 106 is arranged. The MR local coil 100 further includes two first layers 110a, 110b, two second layers 120a, 120b and two third layers 130a, 130b.

On a top side, the top first layer 110a is arranged between the antenna layer 105 and the top second layer 120a. The second layer 120a is arranged between the top first layer 110a and the top third layer 130a. On the opposite side of the antenna layer 105, (e.g., on the bottom side), the first layer 110b is arranged between the antenna layer 105 and the second layer 120b. The second layer 120b is also arranged on this side between the first layer 110b and the third layer 130b. The layer structure is in this case configured as symmetric on both sides of the antenna layer 105.

The top first layer 110a is connected to the bottom first layer 110b via an edge region 111 of the first layers 110a, 110b. Thus, the first layers 110a, 110b together with the edge region 111 completely enclose the antenna layer 105. A possible movement of the antenna layer 105 sideways is limited by the edge region 111 of the first layers 110a, 110b. The first layer may be liquid-tight so that no fluid may penetrate from outside to the antenna layer 105.

The top third layer 130a is also connected to the bottom third layer 130b via an edge region 131 of the third layers 130a, 130b.

The first layers 110a, 110b are movable relative to the second layers 120a, 120b. For example, the layers may move tangentially to the surface 112a, 112b of the first layers 110a, 110b (e.g., in the direction T in this case). This movement is limited laterally by the edge region 131 of the third layers 130a, 130b.

The first layers 110a, 110b in this case have no fixed connection to the second layers 120a, 120b. Rather, the first layers 110a, 110b "float" between the second layers 120a, 120b.

The second layers 120a, 120b are movable relative to the third layers 130a, 130b. Rather, the second layers 120a, 120b are arranged loosely between the first layers 110a, 110b and the third layers 130a, 130b. The second layers 120a, 120b have no fixed connection to the third layers 130a, 130b and/or to the first layers 110a, 110b. Rather, the second layers 120a, 120b "float" between the first layers 110a, 110b and the third layers 130a, 130b.

For example, the second layers 120a, 120b may move tangentially to the surface 122a, 122b of the second layers 120a, 120b (e.g., in the direction T). This movement is limited laterally by the edge region 131 of the third layers 130a, 130b.

The second layers 120a, 120b serve as, for example, a spacer layer that is configured to provide a predefined minimum clearance (e.g., $d_1$ and $d_2$) between the MR antenna and an exterior of the MR local coil. The spacer layer may include, for example, a fibrous web and/or a felt mat and/or a matrix having a plurality of interlinked elements and/or a perforated matrix.

The third layers 130a, 130b in this case form a cover layer that, together with the edge region 131, encloses at least the antenna layer 105, the first layers 110a, 110b, and the second layers 120a, 120b.

The third layers 130a, 130b may be elastic so that the third layers 130a, 130b may reversibly change dimensions (e.g., in the direction T).

The antenna layer 105 has components such as an electronics region 107 in which the antenna layer 105 is rigid. In the other sections, the antenna layer 105 is flexible. The first layers 110a, 110b, second layers 120a, 120b and third layers 130a, 130b are also flexible, thus enabling the MR local coil 100 to be adapted to conform to the geometry of the patient 15. During an acquisition of magnetic resonance signals, the third layer 130b, for example, is in contact with the patient 15 (e.g., the third layer 130b would then be the patient-side layer of the MR local coil 100).

The electronics region 107 is therefore a rigid section of the antenna layer 105. In this region, the antenna layer 105 is connected to the first layer 110a, for example, by an adhesive bond. The antenna layer 105 is therefore attached to the first layer 110a at certain points and/or in certain sections. As a result, the first layer 110a is configured to hold the electronics region 107 (e.g., a component arranged on the antenna layer) in position.

Figure 3:
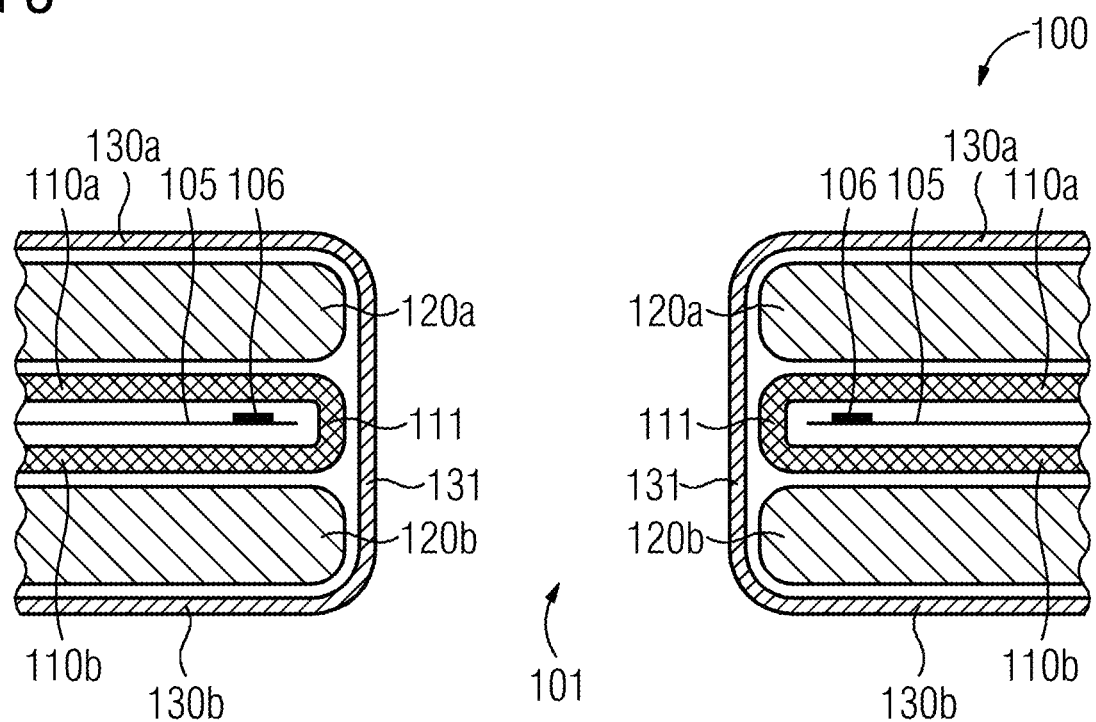
FIG. 3 shows a detail from one embodiment of an MR local coil having an opening in a sectional view.

FIG. 3 shows one embodiment of an MR local coil with an opening 101. For example, such an opening enables the patient to be ventilated, thereby improving patient comfort.

Extending around the opening in this example is an MR antenna 106 that is arranged on the antenna layer 105. The layer structure corresponds to the layer structure illustrated in FIG. 2.

Figure 4:
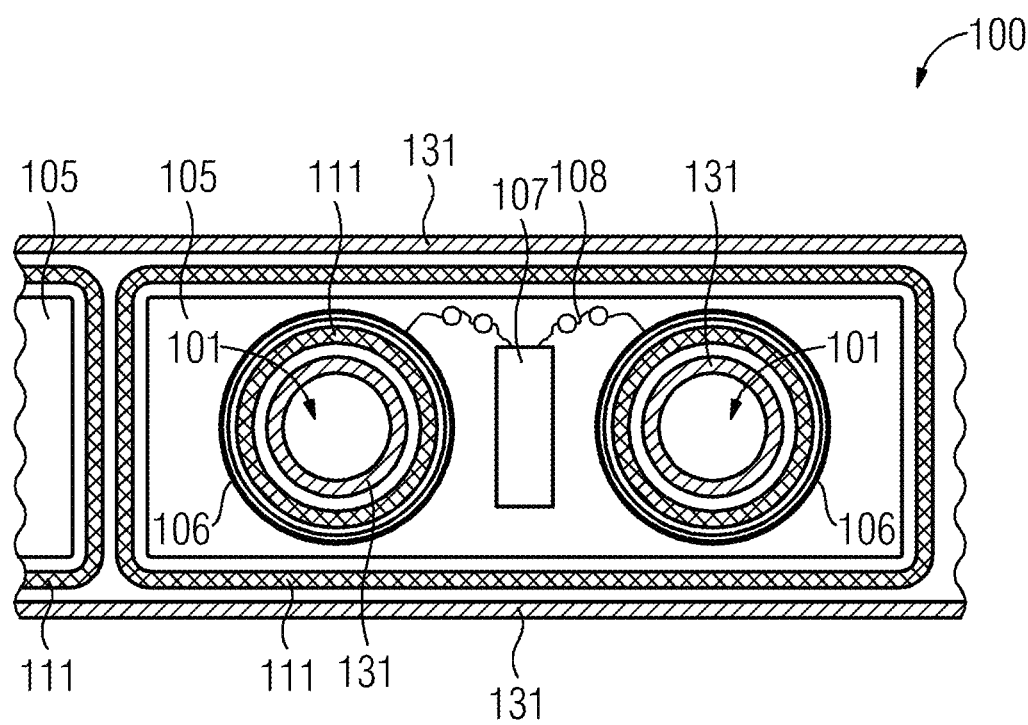
FIG. 4 shows one embodiment of an MR local coil in a plan view.

FIG. 4 shows a plan view onto one embodiment of an MR local coil with two openings 101. The layers are movable relative to one another in the drawing plane of the figure. The movement of the antenna layer 105 is restricted by the edge region 111 of the first layers. The movement of the first layer (not shown here) is restricted, for example, by the edge of the antenna layer 105 and the edge region 131 of the third layers.

Arranged on the antenna layer 105 is an electronics region 107 that is connected to the MR antennas 106 by cabling 108, for example.

Figure 5:
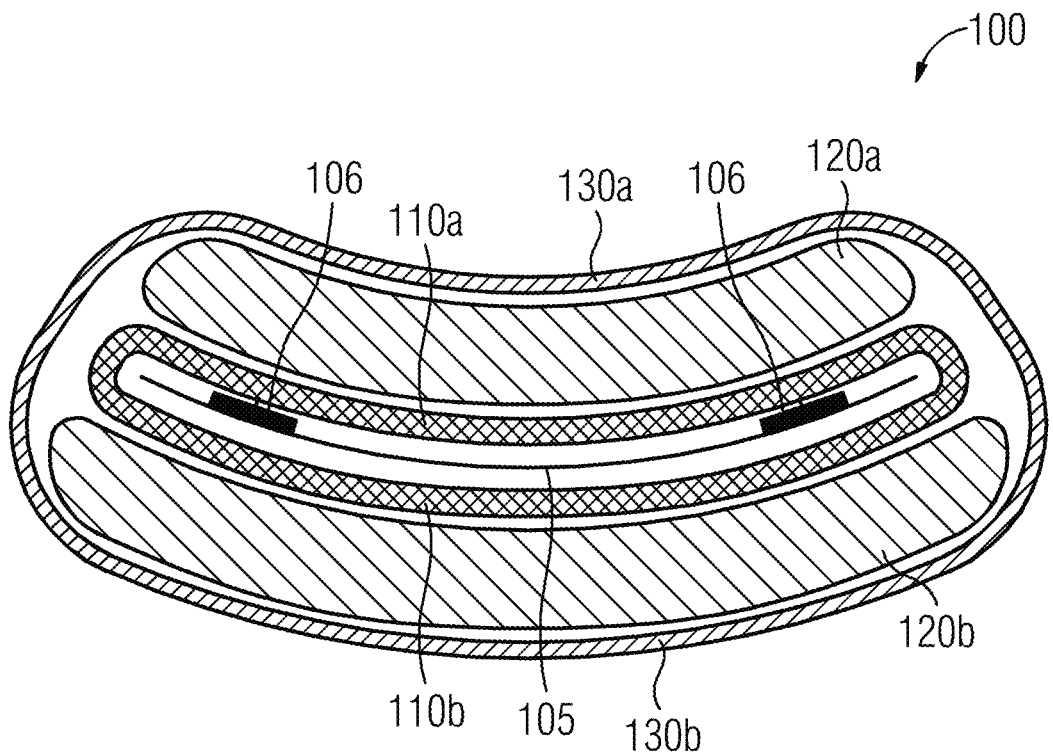
FIG. 5 shows a detail from one embodiment of an asymmetric MR local coil in a sectional view.

FIG. 5 shows one embodiment of an MR antenna 100 in which the first layers 110a, 110b and the second layers 120a, 120b are embodied as asymmetric relative to the antenna layer 105. Thus, the top first layer 110a has smaller dimensions than the bottom first layer 110b. The top second layer 120a has larger dimensions than the bottom second layer 120b. The sides to the right and left of the MR local coil 100 may be bent upward more easily as a result. In other words, a preferred bending direction and/or a preferred movability of the MR local coil are/is established.

Figure 6:
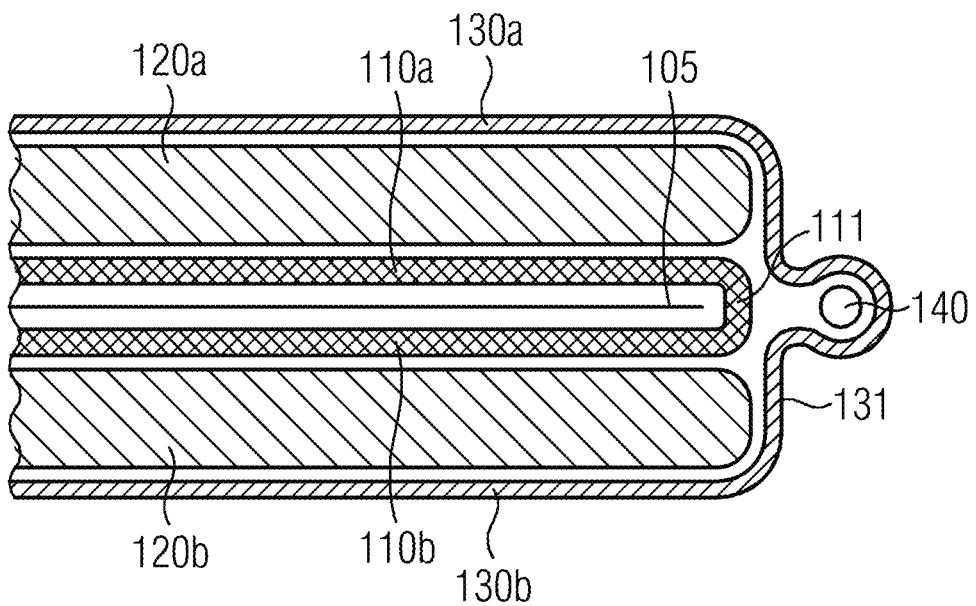
FIG. 6 shows a detail from one embodiment of an MR local coil having a piping strip in a sectional view.

FIG. 6 shows one embodiment of an MR antenna 100 in which a piping strip 140 is arranged in the edge region 131 of the third layers. This allows particularly attractive edge regions to be produced.

The third layer as a cover layer and/or an outer skin is maximally elastic. The antenna layer held in position in the first layer may be easily slidable within the structure of the layer arrangement and/or may be highly flexible itself, owing to a very thin material structure. In one embodiment, the second layer maintains a minimum clearance from the patient while having the best possible sliding behavior with respect to the third layer. The third layer may have a durable surface. The surface of the third layer may allow for easy cleaning and/or fulfills any biocompatibility requirements.

The methods described in detail in the foregoing, as well as the illustrated MR local coil and MR apparatus, are merely exemplary embodiments that may be modified in the widest variety of ways by the person skilled in the art without leaving the scope of the invention. The use of the indefinite articles "a" or "an" does not exclude the possibility that the features in question may also be present more than once. Similarly, the term "unit" does not rule out the possibility that the components in question consist of a plurality of cooperating subcomponents, which, where necessary, may also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance (MR) local coil comprising:
   at least one antenna layer;
   at least one first layer, wherein the at least one first layer is liquid-tight;
   at least one second layer;
   at least one third layer; and
   at least one MR antenna arranged on the at least one antenna layer,
   wherein a portion of the at least one first layer is arranged between the at least one antenna layer and the at least one second layer,
   wherein the at least one second layer is arranged between the at least one first layer and the at least one third layer, and
   wherein the at least one first layer, the at least one second layer, and the at least one third layer are non-antenna layers or not the at least one MR antenna.

2. The MR local coil of claim 1, wherein one or more first layers of the at least one first layer, one or more second layers of the at least one second layer, and one or more third layers of the at least one third layer are arranged on both sides of the at least one antenna layer, respectively.

3. The MR local coil of claim 1, wherein the at least one first layer, the at least one second layer, and the at least one third layer are flexible at least in certain sections.

4. The MR local coil of claim 1, wherein the at least one first layer is movable relative to the at least one second layer, the at least one second layer is movable relative to the at least one third layer, or a combination thereof.

5. The MR local coil of claim 1, wherein the at least one antenna layer has no fixed connection to the at least one first layer.

6. The MR local coil of claim 1, wherein the at least one antenna layer is attached at least at certain points, in certain sections, or at certain points and in certain sections to the at least one first layer.

7. The MR local coil of claim 6, wherein the at least one antenna layer comprises at least one rigid section in which the at least one antenna layer is attached to the at least one first layer.

8. The MR local coil of claim 1, wherein the at least one first layer is configured to hold at least one component arranged on the at least one antenna layer in position.

9. The MR local coil of claim 1, wherein the at least one first layer encloses the antenna layer at least partially.

10. The MR local coil of claim 9, wherein the at least one first layer encloses the antenna layer completely, such that the at least one first layer surrounds all sides of the antenna layer.

11. The MR local coil of claim 1, wherein the at least one second layer is a spacer layer configured to provide a predefined minimum clearance between the at least one MR antenna and an exterior of the MR local coil.

12. The MR local coil of claim 11, wherein the spacer layer comprises a fibrous web, a felt mat, a matrix having a plurality of interlinked elements, a perforated matrix, or any combination thereof.

13. The MR local coil of claim 1, wherein the at least one third layer is a cover layer that encloses the at least one antenna layer, the at least one first layer, and the at least one second layer at least partially.

14. The MR local coil of claim 13, wherein the at least one third layer encloses the at least one antenna layer, the at least one first layer, and the at least one second layer completely.

15. The MR local coil of claim 1, wherein the at least one third layer is elastic.

16. The MR local coil of claim 1, wherein the at least one first layer, the at least one second layer, or the at least one first layer and the at least one second layer are configured as asymmetric relative to the antenna layer.

17. A magnetic resonance (MR) apparatus comprising:
    an MR local coil comprising:
       at least one antenna layer;
       at least one first layer;
       at least one second layer;
       at least one third layer; and
       at least one MR antenna arranged on the at least one antenna layer,
    wherein a portion of the at least one first layer is arranged between the at least one antenna layer and the at least one second layer,
    wherein the at least one second layer is arranged between the at least one first layer and the at least one third layer, and
    wherein the at least one first layer, the at least one second layer, and the at least one third layer are non-antenna layers or not the at least one MR antenna.

18. The MR apparatus of claim 17, wherein one or more first layers of the at least one first layer, one or more second layers of the at least one second layer, and one or more third layers of the at least one third layer are arranged on both sides of the at least one antenna layer, respectively.

19. The MR apparatus of claim 17, wherein the at least one first layer, the at least one second layer, and the at least one third layer are flexible at least in certain sections.

20. A magnetic resonance (MR) local coil comprising:
    at least one antenna layer;
    at least one first layer, wherein the at least one first layer encloses the antenna layer completely, such that the at least one first layer surrounds all sides of the antenna layer;
    at least one second layer;
    at least one third layer; and
    at least one MR antenna arranged on the at least one antenna layer,
    wherein a portion of the at least one first layer is arranged between the at least one antenna layer and a portion of the at least one second layer, and
    wherein a portion of the at least one second layer is arranged between the portion of the at least one first layer and a portion of the at least one third layer.

* * * * *